US011373884B2

(12) United States Patent
Kitagawa et al.

(10) Patent No.: US 11,373,884 B2
(45) Date of Patent: *Jun. 28, 2022

(54) PLACING TABLE AND PLASMA TREATMENT APPARATUS

(71) Applicant: Tokyo Electron Limited, Tokyo (JP)

(72) Inventors: Dai Kitagawa, Miyagi (JP); Katsuyuki Koizumi, Miyagi (JP); Tsutomu Nagai, Miyagi (JP); Daisuke Hayashi, Miyagi (JP); Satoru Teruuchi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 151 days.

This patent is subject to a terminal disclaimer.

(21) Appl. No.: 16/866,232

(22) Filed: May 4, 2020

(65) Prior Publication Data
US 2020/0266081 A1    Aug. 20, 2020

Related U.S. Application Data

(63) Continuation of application No. 15/308,686, filed as application No. PCT/JP2015/065738 on Jun. 1, 2015, now Pat. No. 10,679,869.

(30) Foreign Application Priority Data

Jun. 12, 2014 (JP) ................. 2014-121454

(51) Int. Cl.
*H01L 21/67* (2006.01)
*H01J 37/32* (2006.01)
*H01L 21/683* (2006.01)

(52) U.S. Cl.
CPC .. *H01L 21/67069* (2013.01); *H01J 37/32009* (2013.01); *H01J 37/32715* (2013.01);
(Continued)

(58) Field of Classification Search
CPC ......... H01L 21/67069; H01L 21/67248; H01L 21/6831; H01L 21/67103; H01L 21/02315;
(Continued)

(56) References Cited

U.S. PATENT DOCUMENTS 5,306,895 A    4/1994 Ushikoshi et al.
10,392,703 B2    8/2019 Hisano et al.
(Continued)

FOREIGN PATENT DOCUMENTS

JP    2003-115529 A    4/2003
JP    2007-250589 A    9/2007
(Continued)

OTHER PUBLICATIONS

International Search Report issued in PCT/JP2015/065738; dated Aug. 25, 2015.

*Primary Examiner* — Jeffrie R Lund
(74) *Attorney, Agent, or Firm* — Studebaker & Brackett PC

(57) ABSTRACT

A placing table on an embodiment includes a supporting member and a base. The supporting member includes a placing region provided with a heater, and an outer peripheral region surrounding the placing region. The base includes a first region supporting the placing region thereon, and a second region surrounding the first region. In the second region, through holes are formed. Wirings electrically connected to the heater passes through the through holes of the second region.

8 Claims, 6 Drawing Sheets

(52) U.S. Cl.
CPC .. *H01J 37/32724* (2013.01); *H01J 37/32908* (2013.01); *H01L 21/67103* (2013.01); *H01L 21/67248* (2013.01); *H01L 21/6831* (2013.01); *H01J 2237/334* (2013.01)

(58) Field of Classification Search
CPC ............. H01L 21/0234; H01L 21/3065; H01L 21/67098; H01L 21/68; H01J 37/32908; H01J 37/32724; H01J 37/32009; H01J 37/32715; H01J 2237/334
See application file for complete search history.

(56) References Cited

U.S. PATENT DOCUMENTS

| | | | |
|---|---|---|---|
| 10,512,125 B2 | 12/2019 | Kitagawa | |
| 10,679,869 B2* | 6/2020 | Kitagawa | .......... H01L 21/67069 |
| 2004/0182321 A1 | 9/2004 | Kuibira et al. | |
| 2004/0206747 A1 | 10/2004 | Ito | |
| 2005/0045618 A1 | 3/2005 | Ito | |
| 2007/0258186 A1 | 11/2007 | Matyushkin et al. | |
| 2012/0205024 A1 | 8/2012 | Sugaya et al. | |
| 2012/0211933 A1 | 8/2012 | Goto | |
| 2014/0069585 A1 | 3/2014 | Aoto et al. | |
| 2014/0253900 A1 | 9/2014 | Cornelissen et al. | |
| 2015/0155193 A1 | 6/2015 | Hsu et al. | |
| 2015/0325432 A1 | 11/2015 | Ishizaka | |
| 2017/0096737 A1 | 4/2017 | Hisano et al. | |
| 2017/0140954 A1 | 5/2017 | Kitagawa et al. | |
| 2017/0290099 A1 | 10/2017 | Takebayashi et al. | |
| 2018/0144945 A1 | 5/2018 | Takahashi et al. | |
| 2020/0266081 A1* | 8/2020 | Kitagawa | .......... H01L 21/67103 |

FOREIGN PATENT DOCUMENTS

| | | |
|---|---|---|
| JP | 2007-332465 A | 12/2007 |
| JP | 2008-118052 A | 5/2008 |
| JP | 2010-157559 A | 7/2010 |
| JP | 3181603 U | 2/2013 |
| JP | 2013-175573 A | 9/2013 |
| JP | 2014-053481 A | 3/2014 |

* cited by examiner

PLACING TABLE AND PLASMA TREATMENT APPARATUS

CROSS-REFERENCE TO RELATED APPLICATIONS

This application is a Continuation of U.S. patent application Ser. No. 15/308,686 filed Nov. 3, 2016, which is the U.S. National Stage of International Application No. PCT/JP2015/065738 filed Jun. 1, 2015, which claims benefit of priority to Japanese Patent Application No. 2014-121454 filed Jun. 12, 2014, the entire content of which is incorporated herein by reference.

TECHNICAL FIELD

Embodiments of the present invention relate to a placing table and a plasma treatment apparatus.

BACKGROUND ART

In manufacture of an electronic device such as a semiconductor device, a plasma treatment apparatus that generates plasma by exciting a process gas and processes a workpiece by the plasma has been used. The plasma treatment apparatus includes a placing table on which the workpiece is placed.

The placing table includes an electrostatic chuck and a base. The electrostatic chuck includes a main body formed of a dielectric material, a chucking electrode embedded in the main body, and a heater. The main body has a placing region on which a workpiece is placed. The heater controls the temperature of the workpiece. Therefore, the heater is provided within the placing region. In addition, the electrostatic chuck exposes a contact portion, electrically connected to the heater, from a bottom surface of the placing region. The electrostatic chuck is provided on the base. In the base, a flow channel through which a medium for temperature adjustment is circulated is formed. In addition, a through hole leading to the contact portion is formed in the base, and a wiring connected to the contact region is inserted into the through hole. The wiring is connected to a heater power supply.

CITATION LIST

Patent Literature

[Patent Literature 1] Japanese Patent Application Laid-Open Publication No. 2013-175573

SUMMARY OF INVENTION

Technical Problem

Incidentally, the plasma treatment apparatus requires in-plane uniformity of processing of a workpiece. In order to improve the in-plane uniformity, it is necessary to reduce an in-plane variation in temperature of the workpiece.

Solution to Problem

In an aspect, a placing table for placing a workpiece thereon is provided. The placing table includes a supporting member, a base, and a plurality of wirings. The supporting member is a member for supporting the workpiece, and includes a main body, one or more heaters, one or more first wiring layers, one or more second wiring layers, and a plurality of contact portions. The main body is formed of a ceramic, and includes a placing region on which a workpiece is to be placed, and an outer peripheral region surrounding the placing region. The one or more heaters are provided in the main body. The one or more first wiring layers extend in the main body, and are electrically connected to power feed sides of the one or more heaters, respectively. The one or more second wiring layers extend in the main body, and are electrically connected to reference potential sides of the one or more heaters, respectively. The plurality of contact portions are exposed from the main body in the outer peripheral region, and are electrically connected to the one or more first wiring layers and the one or more second wiring layers, respectively. The base includes a first region supporting the placing region thereon, and a second region supporting the outer peripheral region thereon. In the second region, a plurality of first through holes respectively leading to the plurality of contact portions are formed. The plurality of wirings pass through the plurality of first through holes and are bonded to the plurality of contact portions, respectively.

The through holes formed in the base may result in temperature singular points in the supporting member. However, in the placing table according to the above-described aspect, the plurality of first through holes leading to the plurality of contact portions are provided in the second region that surrounds the first region, rather than being provided in the first region supporting the placing region thereon. Therefore, it is possible to suppress the generation of temperature singular points in the placing region of the supporting member. As a result, in plasma treatment with the placing table, it is possible to reduce an in-plane variation in temperature of a workpiece.

In an embodiment, one or more heaters may be a plurality of heaters, and one or more first wiring layers may be a plurality of first wiring layers connected to power feed sides of the plurality of heaters, respectively. In the placing table, the number of first through holes increases as the number of heaters increases. According to this embodiment, since the first through holes are provided in the second region, it is possible to suppress the generation of temperature singular points in the placing region of the supporting member even when the number of first through holes increases as the number of heaters increases.

In an embodiment, at least one of the one or more second wiring layers may be connected to the reference potential sides of two or more heaters among the plurality of heaters. In this embodiment, a wiring layer connected to the reference potential sides of the two or more heaters are shared. Therefore, it is possible to reduce the number of contact portions for a reference potential, the number of wirings for a reference potential, and the number of through holes for allowing the wirings for a reference potential to pass therethrough.

In an embodiment, a coolant flow channel to which a coolant is to be supplied may be formed in the base.

In an embodiment, the supporting member further includes in the main body an electrode for electrostatic attraction, a third wiring layer which is electrically connected to the electrode for electrostatic attraction, and another contact portion electrically connected to the third wiring layer. The other contact portion is exposed from the main body in the outer peripheral region. In the second region, second through hole leading to the other contact portion is formed. The placing table may further include another wiring which passes through the second through hole and is bonded to the other contact portion. In this embodiment, the supporting member functions as an electrostatic chuck. In addition, since the second through hole is provided in the second region, it is possible to suppress the generation of a temperature singular point in the placing region.

In an embodiment, the base may include a conductive main portion and an insulating portion. In this embodiment, the main portion provides the first region and the second region. The insulating portion is detachably attached to the main portion and provides the plurality of first through holes. Each of the plurality of wirings includes a flexible lead wire having one end and the other end, a first terminal coupled to the one end of the lead wire and coupled to a corresponding contact portion among the plurality of contact portions, and a second terminal coupled to the other end of the lead wire. A space exists from an inner surface of the insulating portion defining a first through hole in which the first terminal and the lead wire are inserted, to the first terminal and the lead wire. According to this embodiment, even when thermal expansion of the base occurs, stress due to the thermal expansion is alleviated by the lead wire. Therefore, the reliability of coupling between the first terminal and the contact portion is enhanced.

In an embodiment, the base may further include a conductive main portion, a first insulating portion, and a second insulating portion. In this embodiment, the main portion provides the first region and the second region. The first insulating portion is detachably attached to the main portion and provides the plurality of first through holes. The second insulating portion is detachably attached to the main portion and provides the second through hole. The first insulating portion and the second insulating portion may be an integrated insulating member. Each of the plurality of wirings includes a flexible first lead wire having one end and the other end, a first terminal coupled to the one end of the first lead wire and coupled to a corresponding contact portion among the plurality of contact portions, and a second terminal coupled to the other end of the first lead wire. A space exists from an inner surface of the first insulating portion defining a first through hole in which the first terminal and the first lead wire are inserted, to the first terminal and the first lead wire. The other wiring includes a flexible second lead wire having one end and the other end, a third terminal coupled to the one end of the second lead wire and coupled to the other contact portion, and a fourth terminal coupled to the other end of the second lead wire. A space exists from an inner surface of the second insulating portion defining the second through hole, to the third terminal and the second lead wire. According to this embodiment, even when thermal expansion of the base occurs, stress due to the thermal expansion is alleviated by the first lead wire and the second lead wire. Therefore, the reliability of coupling between the first terminal and the contact portion and the reliability of coupling between the third terminal and the other contact portion are enhanced.

In an embodiment, the placing table may further include a tubular insulating portion interposed between the third terminal and the second insulating portion. According to this embodiment, higher dielectric strength is obtained in the vicinity of the third terminal.

In another aspect, a plasma treatment apparatus is provided. The plasma treatment apparatus includes a processing container, and the placing table according to the above-described aspect or any one of the various embodiments. The placing table is provided in the processing container.

According to the plasma treatment apparatus, an in-plane variation in temperature of a workpiece may be suppressed.

Advantageous Effects of Invention

As described above, a placing table and a plasma treatment apparatus capable of reducing an in-plane variation in temperature of a workpiece are provided.

DESCRIPTION OF EMBODIMENTS

Figure 1:
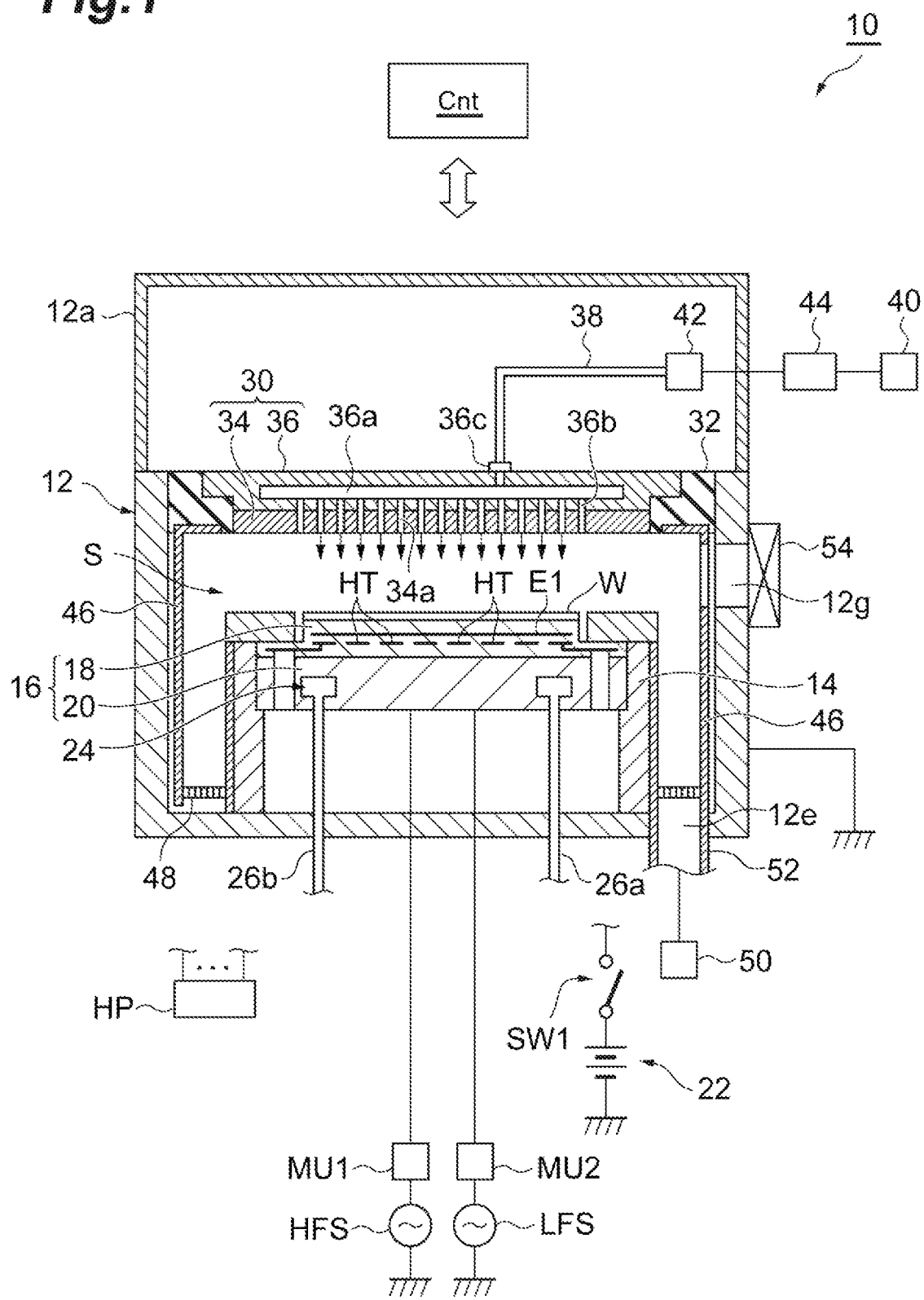
FIG. 1 is a diagram schematically illustrating a plasma treatment apparatus according to an embodiment.

Hereinafter, various embodiments will be described in detail with reference to the accompanying drawings. In the drawings, the same or equivalent portions will be denoted with the same reference signs.

FIG. 1 is a diagram schematically illustrating a plasma treatment apparatus according to an embodiment. In FIG. 1, a structure in a cross-section of the plasma treatment apparatus according to the embodiment is schematically illustrated. A plasma treatment apparatus 10 shown in FIG. 1 is a capacitively-coupled parallel flat plate plasma etching apparatus. The plasma treatment apparatus 10 includes a processing container 12 having a substantially cylindrical shape. The processing container 12 is formed of, for example, aluminum, and anodic oxidation is applied on the surface thereof.

A placing table 16 is provided in the processing container 12. The placing table 16 includes a supporting member 18 and a base 20. The base 20 has a substantially disc shape, and is formed of a conductive metal, such as aluminum, in the main portion thereof. The base 20 constitutes a lower electrode. The base 20 is supported by a supporting portion 14. The supporting portion 14 is a cylindrical member extending from the bottom of the processing container 12.

A first frequency power supply HFS is electrically connected to the base 20 through a matching device MU1. The first frequency power supply HFS is a power supply that generates a high frequency power for generating plasma. The first frequency power supply HFS generates a high frequency power having a frequency of 27 MHz to 100 MHz, for example, 40 MHz. The matching device MU1 includes a circuit for matching output impedance of the first frequency power supply HFS and input impedance on a load side (base 20 side) to each other.

In addition, a second frequency power supply LFS is electrically connected to the base 20 through a matching device MU2. The second frequency power supply LFS generates high frequency power (high frequency bias power) for attracting ions to a wafer W, and supplies the high frequency bias power to the base 20. The frequency of the high frequency bias power is a frequency in a range of 400 kHz to 13.56 MHz, for example, 3 MHz. The matching device MU2 includes a circuit for matching output impedance of the second frequency power supply LFS and input impedance on a load side (base 20 side) to each other.

The supporting member 18 is provided on the base 20. In an embodiment, the supporting member 18 is an electrostatic chuck. That is, in an embodiment, the supporting member 18 attracts the wafer W by an electrostatic force such as Coulomb force to hold the wafer. The supporting member 18 includes an electrode μl for electrostatic attraction in a ceramic main body. A direct current power supply 22 is electrically connected to the electrode μl through a switch SW1.

A focus ring FR is provided on an upper surface of the base 20 and around the supporting member 18. The focus ring FR is provided in order to improve uniformity of plasma treatment. The focus ring FR is formed of a material which is appropriately selected in accordance with plasma treatment to be performed, and may be formed of, for example, silicon or quartz.

A coolant flow channel 24 is formed inside the base 20. A coolant is supplied to the coolant flow channel 24 through a pipe 26a from a chiller unit provided outside the processing container 12. The coolant supplied to the coolant flow channel 24 returns to the chiller unit through a pipe 26b. Details of the placing table 16 including the base 20 and the supporting member 18 will be described later.

An upper electrode 30 is provided in the processing container 12. The upper electrode 30 is disposed so as to face the base 20 above the placing table 16, and the base 20 and the upper electrode 30 are provided substantially in parallel with each other.

The upper electrode 30 is supported by an upper portion of the processing container 12 through an insulating shielding member 32. The upper electrode 30 may include an electrode plate 34 and an electrode support 36. The electrode plate 34 faces a processing space S, and provides a plurality of gas discharge holes 34a. The electrode plate 34 may be formed of a low resistance conductor or semiconductor with little Joule heat.

The electrode support 36 detachably supports the electrode plate 34, and may be formed of a conductive material such as aluminum. The electrode support 36 may have a water-cooling structure. A gas diffusion chamber 36a is provided inside the electrode support 36. A plurality of gas communication holes 36b communicating with a gas discharge hole 34a extend downward from the gas diffusion chamber 36a. In addition, a gas introduction port 36c for guiding a process gas to the gas diffusion chamber 36a is formed in the electrode support 36, and a gas supply pipe 38 is connected to the gas introduction port 36c.

A gas source group 40 is connected to the gas supply pipe 38 through a valve group 42 and a flow rate controller group 44. The valve group 42 includes a plurality of on-off valves, and the flow rate controller group 44 includes a plurality of flow rate controllers such as mass flow controllers. In addition, the gas source group 40 includes gas sources for a plurality of types of gases necessary for plasma treatment. The plurality of gas sources of the gas source group 40 are connected to the gas supply pipe 38 through the corresponding on-off valve and the corresponding mass flow controller.

In the plasma treatment apparatus 10, one or more gases from one or more gas sources selected among the plurality of gas sources of the gas source group 40 are supplied to the gas supply pipe 38. The gas supplied to the gas supply pipe 38 reaches the gas diffusion chamber 36a, and is output to the processing space S through the gas flowing holes 36b and the gas discharge holes 34a.

As shown in FIG. 1, the plasma treatment apparatus 10 may further include a ground conductor 12a. The ground conductor 12a is a ground conductor having a substantially cylindrical shape, and is provided so as to extend further upward than a height position of the upper electrode 30 from a side wall of the processing container 12.

In addition, in the plasma treatment apparatus 10, a deposition shield 46 is detachably provided along an inner wall of the processing container 12. The deposition shield 46 is also provided at the inner periphery of the supporting portion 14. The deposition shield 46 prevents etching by-products (deposition) from being attached to the processing container 12, and may be formed of, for example, an aluminum material covered with ceramics such as $Y_2O_3$.

An exhaust plate 48 is provided between the supporting portion 14 and the inner wall of the processing container 12 on the bottom side of the processing container 12. The exhaust plate 48 may be formed of, for example, an aluminum material covered with ceramics such as $Y_2O_3$. The processing container 12 is provided with an exhaust port 12e below the exhaust plate 48. An exhaust device 50 is connected to the exhaust port 12e through an exhaust pipe 52. The exhaust device 50 includes a vacuum pump such as a turbo molecular pump, and can depressurize the inside of the processing container 12 to a desired degree of vacuum. In addition, a transfer-in/out port 12g of the wafer W is provided in the inner wall of the processing container 12, and the transfer-in/out port 12g can be opened and closed by the gate valve 54.

In addition, the plasma treatment apparatus 10 may further include a control unit Cnt. The control unit Cnt is a computer that includes a processor, a storage unit, an input device, a display device, and the like, and controls each portion of the plasma treatment apparatus 10. In the control unit Cnt, an operator can perform an input operation of a command, and the like using the input device in order to manage the plasma treatment apparatus 10, and an operation situation of the plasma treatment apparatus 10 can be displayed to be visualized using the display device. Furthermore, the storage unit of the control unit Cnt stores a control program for controlling various processes executed by the plasma treatment apparatus 10 using the processor, and a program, that is, a processing recipe for allowing each component of the plasma treatment apparatus 10 to execute processing in accordance with processing conditions.

Figure 2:
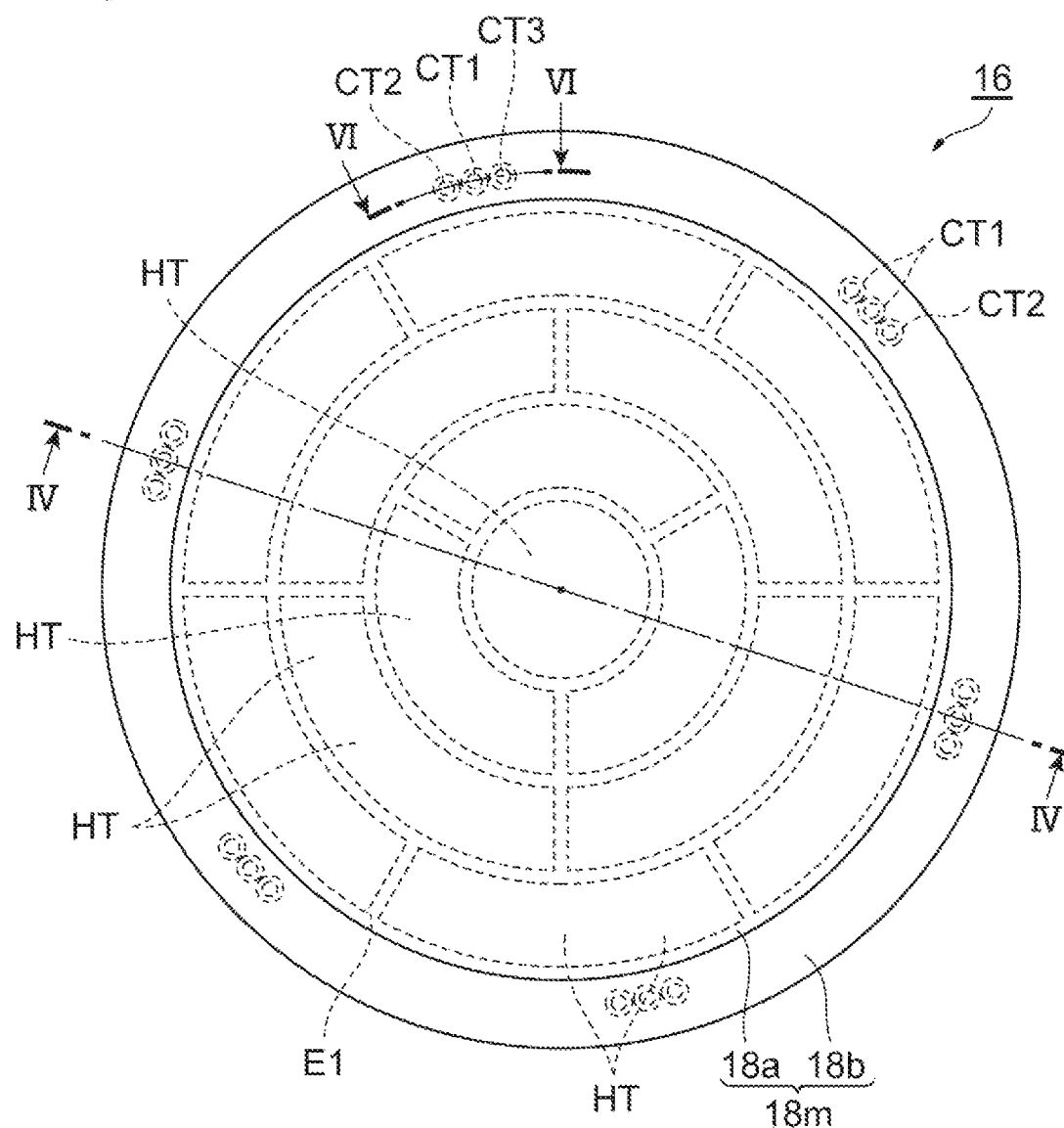
FIG. 2 is a plan view illustrating a placing table according to an embodiment.
Figure 3:
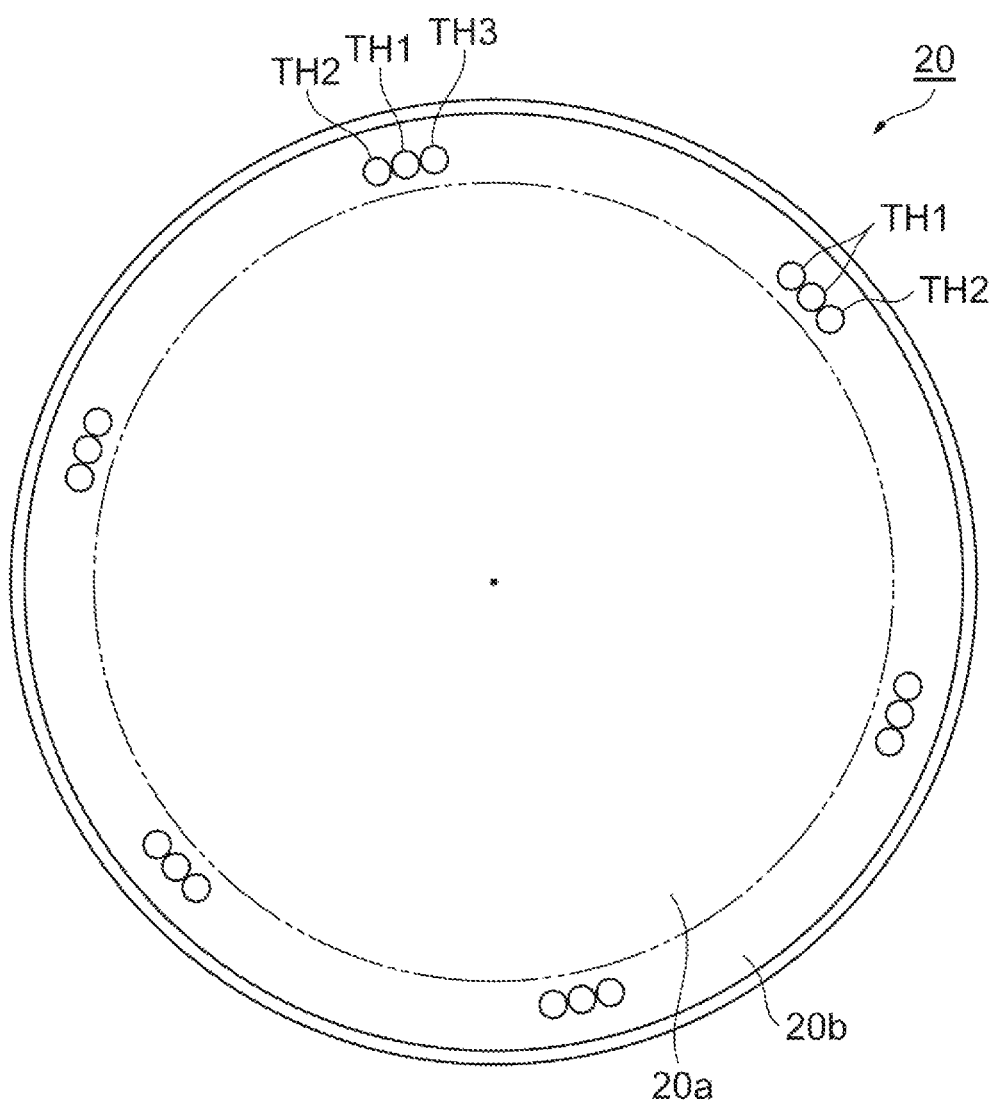
FIG. 3 is a plan view illustrating a base of a placing table according to an embodiment.
Figure 4:
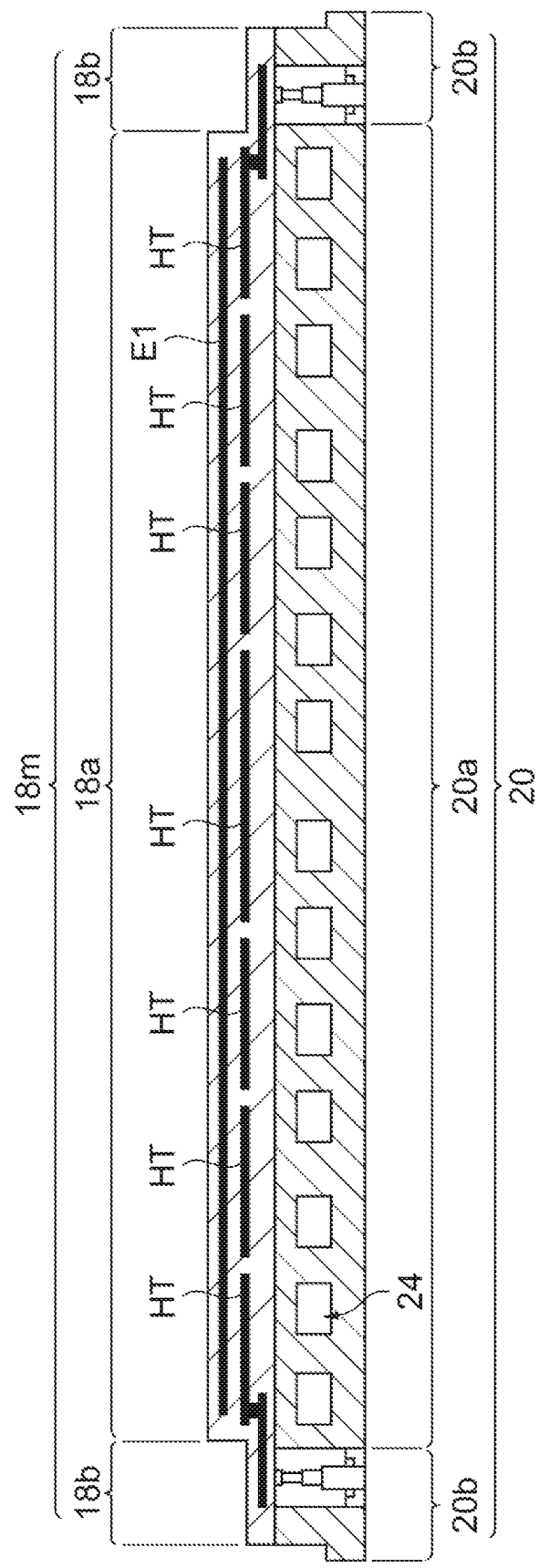
FIG. 4 is a cross-sectional view taken along line IV-IV of FIG. 2.
Figure 5:
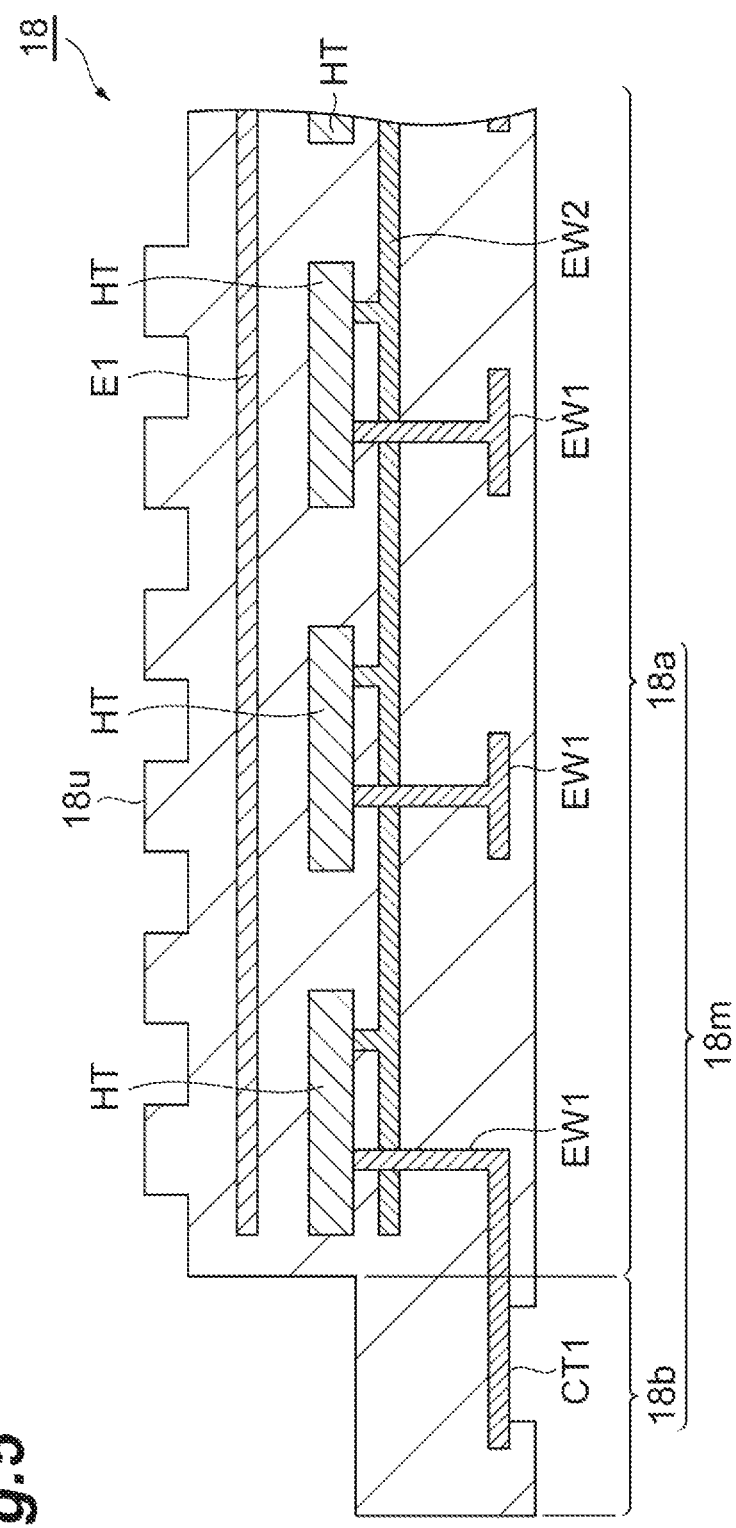
FIG. 5 is an enlarged cross-sectional view of a portion of a supporting member according to an embodiment.
Figure 6:
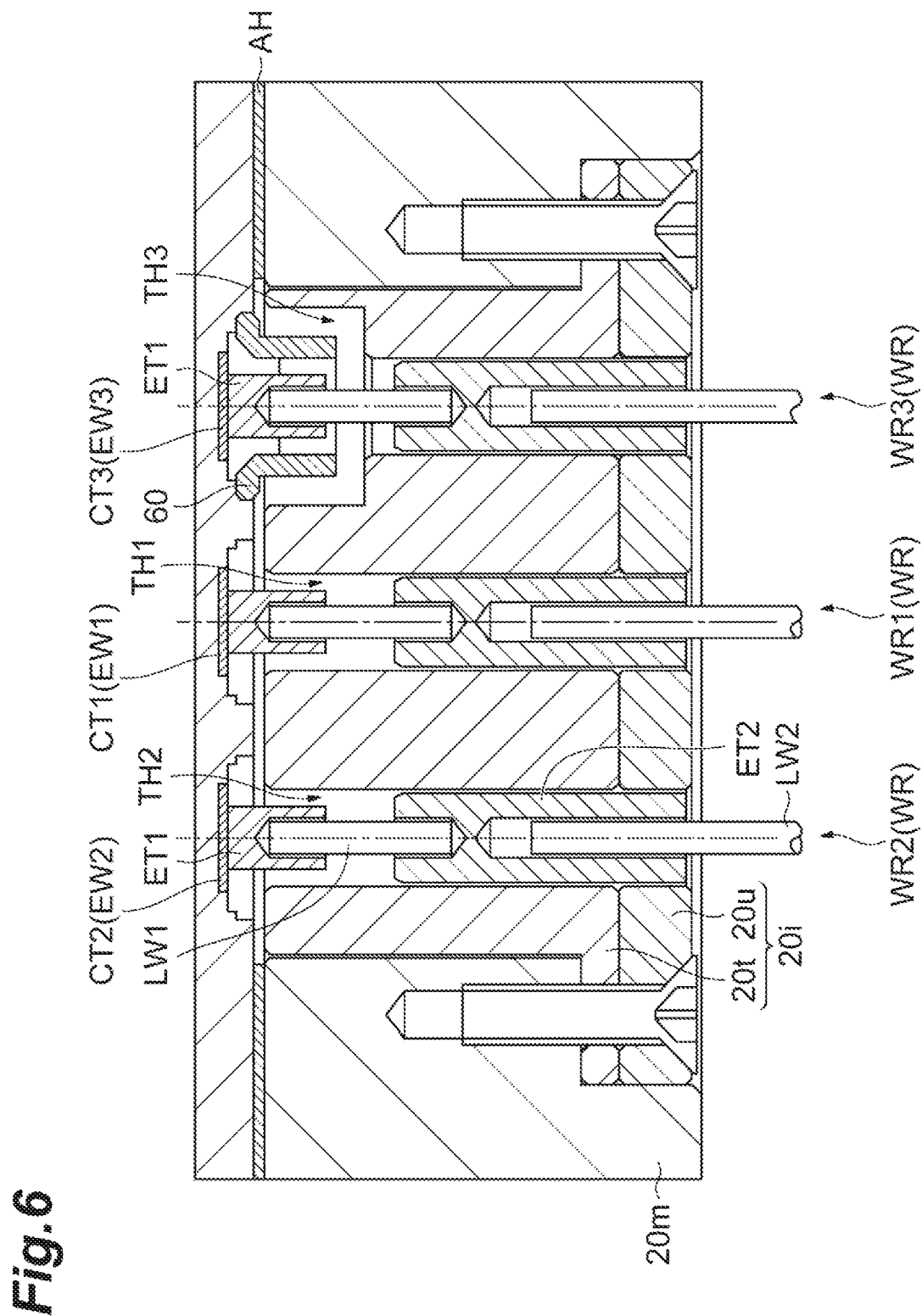
FIG. 6 is a cross-sectional view taken along line VI-VI of FIG. 2.

Hereinafter, the placing table 16 will be described in detail with reference to FIGS. 2 to 6. FIG. 2 is a plan view illustrating a placing table according to an embodiment. FIG. 3 is a plan view illustrating a base of a placing table according to an embodiment. FIG. 4 is a cross-sectional view taken along line IV-IV of FIG. 2. FIG. 5 is an enlarged cross-sectional view of a portion of a supporting member according to an embodiment. In addition, FIG. 6 is a cross-sectional view taken along line VI-VI of FIG. 2.

As described above, the placing table 16 includes the supporting member 18 and the base 20. The supporting member 18 includes a ceramic main body 18m. The main body 18m has a substantially disc shape. The main body 18m provides a placing region 18a and an outer peripheral region 18b. The placing region 18a is a substantially circular region when seen in a planar view. The wafer W which is a workpiece is placed on the upper surface of the placing region 18a. In an embodiment, as shown in FIG. 5, the upper surface of the placing region 18a is configured with top faces of a plurality of protrusions. In addition, the diameter of the placing region 18a is substantially the same as the diameter of the wafer W or is slightly smaller than the diameter of the wafer W. The outer peripheral region 18b is a region that surrounds the placing region 18a, and extends in a substantially annular shape. In an embodiment, the upper surface of the outer peripheral region 18b is positioned lower than the upper surface of the placing region 18a.

As described above, in an embodiment, the supporting member 18 is an electrostatic chuck. The supporting member 18 of this embodiment includes the electrode μl for electrostatic attraction in the placing region 18a. The electrode μl is connected to the direct current power supply 22 through the switch SW1, as described above.

In addition, one or more heaters HT are provided in the placing region 18a and below the electrode μl. In an embodiment, as shown in FIGS. 2, 4, and 5, the placing region 18a is provided with the plurality of heaters HT. For example, as shown in FIG. 2, the plurality of heaters HT are provided within a circular region in the center of the placing region 18a and in a plurality of concentric annular regions that surround the circular region. In addition, the plurality of heaters HT are arranged in a circumferential direction in each of the plurality of annular regions. Power individually adjusted is supplied to each of the heaters HT from a heater power supply HP shown in FIG. 1. Thereby, heat generated by each of the heaters HT is individually controlled, and the temperature of each of a plurality of partial regions within the placing region 18a is individually adjusted.

In addition, as shown in FIGS. 4 and 5, a wiring layer EW1 (first wiring layer) which is electrically connected to a power feed side of the heater HT is provided in the main body 18m of the supporting member 18. In a case where the plurality of heaters HT are provided within the main body 18m, a plurality of wiring layers EW1 individually connected to power feed sides of the plurality of heaters HT are provided in the main body 18m. The wiring layers EW1 extend to an outer peripheral region 18b from the power feed sides of the corresponding heaters HT. For example, each of the wiring layers EW1 may include a linear pattern horizontally extending in the main body 18m and a contact via extending in a direction (for example, a vertical direction) which intersects the linear pattern. In addition, the wiring layers EW1 are electrically connected to respective contact portions CT1 (see FIGS. 2, 5 and 6) in the outer peripheral region 18b. For example, each of the wiring layers EW1 constitutes the contact portion CT1 in the outer peripheral region 18b. In the outer peripheral region 18b, the contact portions CT1 are exposed from the lower surface of the outer peripheral region 18b.

In addition, a wiring layer EW2 (second wiring layer) which is electrically connected to a reference potential side of the heater HT is provided in the main body 18m of the supporting member 18. In a case where the plurality of heaters HT are provided within the main body 18m, the plurality of wiring layers EW2 individually connected to the respective reference potential sides of the plurality of heaters HT are provided in the main body 18m. Alternatively, as shown in FIG. 5, at least one of the plurality of wiring layers EW2 is commonly connected to the reference potential sides of the two or more heaters HT among the plurality of heaters HT. In an embodiment, each of the plurality of wiring layers EW2 is commonly connected to the reference potential sides of the corresponding two or more heaters HT among the plurality of heaters HT. Accordingly, it is possible to reduce the number of contact portions CT2 for a reference potential, the number of wirings WR2 for a reference potential, and the number of through holes TH2 for allowing the wiring WR2 for a reference potential to pass therethrough.

The wiring layers EW2 extend to the outer peripheral region 18b. For example, the wiring layer EW2 may include a linear pattern horizontally extending in the main body 18m, and a contact via extending in a direction (for example, a vertical direction) which intersects the linear pattern. In addition, the wiring layers EW2 are electrically connected to the respective contact portions CT2 (see FIGS. 2 and 6) in the outer peripheral region 18b. For example, each of the wiring layers EW2 constitutes the contact portion CT2 in the outer peripheral region 18b. In the outer peripheral region 18b, the contact portions CT2 are exposed from the lower surface of the outer peripheral region 18b.

Furthermore, a wiring layer EW3 (third wiring layer) which is electrically connected to the electrode μl for electrostatic attraction is provided in the main body 18m of the supporting member 18. The wiring layer EW3 extends from the electrode μl to the outer peripheral region 18b. For example, the wiring layer EW3 may include a linear pattern horizontally extending in the main body 18m and a contact via extending in a direction (for example, a vertical direction) which intersects the linear pattern. In addition, the wiring layer EW3 is electrically connected to a corresponding contact portion CT3 (see FIGS. 2 and 6) in the outer peripheral region 18b. For example, the wiring layer EW3 constitutes the contact portion CT3 in the outer peripheral region 18b. In the outer peripheral region 18b, the contact portion CT3 is exposed from the lower surface of the outer peripheral region 18b.

The supporting member 18 configured as described above is provided on the base 20. In an embodiment, the supporting member 18 is bonded to the base 20 using an adhesive AH (see FIG. 6). The base 20 includes a first region 20a and a second region 20b as shown in FIGS. 3 and 4. The first region 20a is a region having a substantially circular shape when seen in a planar view, and the second region 20b is a region that extends annularly so as to surround the first region 20a. The placing region 18a is mounted on the first region 20a, and the outer peripheral region 18b is mounted on the second region 20b.

The second region 20b is provided with one or more through holes TH1 and one or more through holes TH2 that pass through the second region 20b in a vertical direction. The through holes TH1 and TH2 are first through holes in an embodiment. The through holes TH1 leads to the contact portions CT1, and the through holes TH2 lead to the contact portions CT2. As shown in FIG. 3, in an embodiment, a plurality of through holes TH1 and a plurality of through holes TH2 are provided. The number of through holes TH1 and the number of through holes TH2 are set in accordance with the number of contact portions CT1 and the number of contact portions CT2, respectively.

In an embodiment, the second region 20b is provided with a through hole TH3 (second through hole) which passes through the second region 20b in a vertical direction. The through hole TH3 leads to the contact portion CT3.

Furthermore, in an embodiment, the base 20 includes a main portion 20m as shown in FIG. 6. The main portion 20m has a substantially disc shape, and is formed of a conductive metal such as aluminum. The main portion 20m provides the first region 20a and the second region 20b mentioned above.

In addition, the base 20 further includes an insulating portion 20i. The insulating portion 20i is an insulating member, and is formed of, for example, a resin. The insulating portion 20i is provided in a through hole formed in the main portion 20m of the base 20, and is fixed to the main portion 20m using a fastening unit such as, for example, a screw. That is, the insulating portion 20i is detachable from the main portion 20m of the base 20. In an embodiment, the base 20 includes a plurality of insulating portions 20i. One of the plurality of insulating portions 20i provides the through hole TH1 and the through hole TH3, and the other insulating portions 20i provide the through holes TH1. In addition, some of the plurality of insulating portions 20i may provide the through holes TH2. The insulating portion 20i shown in FIG. 6 provides the through hole TH1, the through hole TH2, and the through hole TH3.

The wirings WR1 pass through the through holes TH1. The wirings WR1 are wirings that connect the heater power supply HP and the contact portions CT1 to each other. In addition, the wirings WR2 pass through the through holes TH2. The wirings WR2 are wirings that connect the heater power supply HP and the contact portions CT2 to each other. In addition, the wiring WR3 passes through the through hole TH3. The wiring WR3 is a wiring that connects the direct current power supply 22 and the contact portion CT3 to each other. The wirings WR1, the wirings WR2, and the wirings WR3 have substantially the same structure. Therefore, hereinafter, a description will be given by collectively referring to the wiring WR1, the wiring WR2, and the wiring WR3 as a wiring WR.

The wiring WR includes a terminal ET1, a lead wire LW1, a terminal ET2, and a lead wire LW2. The terminal ET1 has a tubular shape which is closed at one end. The one end of the terminal ET1 is bonded to a corresponding contact portion. In addition, one end of the lead wire LW1 is bonded to the terminal ET1. The lead wire LW1 has flexibility. That is, the lead wire LW1 has a property of easily bending against stress. The other end of the lead wire LW1 is bonded to the terminal ET2. The terminal ET2 is a member having a substantially tubular shape which has a diameter reduced or closed between one end and the other end thereof. The other end of the lead wire LW1 is coupled to the one end of the terminal ET2, and the lead wire LW2 is coupled to the other end of the terminal ET2. The terminal ET1 (first terminal), the lead wire LW1 (first lead wire), and the terminal ET2 (second terminal) of the wiring WR1 are provided in the through hole TH1, the terminal ET1 (first terminal), the lead wire LW1 (first lead wire), and the terminal ET2 (second terminal) of the wiring WR2 are provided in the through hole TH2, and the terminal ET1 (third terminal), the lead wire LW1 (second lead wire), and the terminal ET2 (fourth terminal) of the wiring WR3 are provided in the through hole TH3.

A space exists from the terminal ET1 and the lead wire LW1 of each wiring WR to an inner surface (inner wall) defining a through hole in which the terminal ET1 and the lead wire LW1 are inserted. For example, a space exists from a wall surface of a through hole which is defined by the insulating portion 20i to the terminal ET1 and the lead wire LW1 which pass through the through hole. Therefore, even when stress is applied to the terminal ET2 due to thermal expansion of the base 20, the stress is alleviated by the deformation of the lead wire LW1, and the transmission of the stress to the terminal ET1 is suppressed. As a result, the reliability of coupling between the terminal ET1 and the corresponding contact portion is enhanced.

In an embodiment, the insulating portion 20i may include an upper portion 20t and a lower portion 20u. The upper portion 20t and the lower portion 20u may be separable from each other, and may be fixed to each other by a fastening unit that fixes the insulating portion 20i to the main portion 20m.

In an embodiment, between the terminal ET1 of the wiring WR3 and the insulating portion 20i, an insulating portion 60 having a tubular shape which surrounds the terminal ET1 is provided, as shown in FIG. 6. The insulating portion 60 is formed of an insulating material. The wiring WR3 is a wiring for applying a voltage to the electrode μl for electrostatic attraction. Therefore, the wiring WR3 requires dielectric strength. Providing such an insulating portion 60 around the terminal ET1 of the wiring WR3 allows dielectric strength in the vicinity of the terminal ET1 to be further enhanced.

In the placing table 16 described above, contact portions of the supporting member 18 are provided in the outer peripheral region 18b, through holes leading to the contact portion are provided in the second region 20b of the base 20. The through holes formed in the base 20 may result in temperature singular points in the supporting member 18. However, in the placing table 16, through holes in which the wirings WR are inserted are provided in the second region 20b, rather than being provided in the first region 20a extending just below the placing region 18a. Therefore, the generation of temperature singular points in the placing region 18a may be suppressed. Accordingly, in plasma treatment with the placing table 16, it is possible to reduce an in-plane variation in temperature of a workpiece such as the wafer W.

Hereinbefore, various embodiments have been described. However, various modifications may be made without being limited to the above-described embodiments. For example, the plasma treatment apparatus 10 described above is a capacitively-coupled plasma treatment apparatus, but the placing table 16 may be adopted for any plasma treatment apparatus. For example, the plasma treatment apparatus may be any type of plasma treatment apparatus such as an inductively-coupled plasma treatment apparatus or a plasma treatment apparatus that excites gas by surface waves such as micro waves.

In addition, in the above-described embodiments, one insulating portion 20i provides a plurality of through holes, but the base 20 may include a plurality of insulating portions 20i that individually provide one or more through holes. For example, the base 20 may include a plurality of first insulating portions that individually provide the through holes TH1 and the through holes TH2, and a second insulating portion that provides the through hole TH3.

In addition, in the above-described embodiments, the supporting member 18 is an electrostatic chuck, but the supporting member 18 may not be an electrostatic chuck as long as the supporting member is a member on which a workpiece is placed. In this case, elements such as the electrode μl, the wiring WR3, and the wiring layer EW3 may be omitted from the placing table 16.

REFERENCE SIGNS LIST

10: plasma treatment apparatus, 12: processing container, 16: placing table, 18: supporting member, 18a: placing region, 18b: outer peripheral region, 18m: main body, μl: electrode for electrostatic attraction, HT: heater, EW1: wiring layer (first wiring layer), EW2: wiring layer (second wiring layer), EW3: wiring layer (third wiring layer), CT1: contact portion, CT2: contact portion, CT3: contact portion, 20: base, 20a: first region, 20b: second region, 20m: main portion, 20i: insulating portion, TH1: through hole (first through hole), TH2: through hole (first through hole), TH3: through hole (second through hole), 24: coolant flow channel, 60: insulating portion, WR1: wiring, WR2: wiring, WR3: wiring, ET1: terminal (first terminal or third terminal), ET2: terminal (second terminal or fourth terminal), LW1: lead wire, LW2: lead wire.

The invention claimed is:

1. A placing table comprising:
   a supporting member that includes
      a main body including a placing region for placing a workpiece thereon and an outer peripheral region surrounding the placing region,
      an electrode disposed in the main body,
      a wiring layer electrically connected to the electrode, and
      a contact portion electrically connected to the electrode and exposed from the main body in the outer peripheral region;
   a base supporting the supporting member, the base including a first region supporting the placing region thereon and a second region supporting the outer peripheral region thereon, a through hole leading to the contact portion being formed in the second region; and
   a wiring passing through the through hole and bonded to the contact portion,
   wherein the base includes
      a main portion providing the first region and the second region, and
      an insulating portion disposed in the second region and providing the through hole,
   the wiring includes a lead wire and a terminal electrically connected to one end of the lead wire and electrically connected to the contact portion,
   a space exists from the terminal and the lead wire to an inner surface of the insulating portion defining the through hole, and
   the placing table further comprises a tubular insulator inserted into the through hole to provide an unfilled space between the terminal and the tubular insulator.

2. The placing table according to claim 1, wherein the electrode is an electrode for electrostatic attraction.

3. The placing table according to claim 1, wherein the supporting member further includes:
   one or more heaters provided within the main body;
   one or more first wiring layers extending in the main body and electrically connected to power feed sides of the one or more heaters, respectively,
   one or more second wiring layers extending in the main body and electrically connected to reference potential sides of the one or more heaters, respectively; and
   a plurality of other contact portions exposed from the main body in the outer peripheral region and electrically connected to the one or more first wiring layers and the one or more second wiring layers, respectively,
   a plurality of other through holes leading to the plurality of other contact portions are formed in the second region, and
   the placing table further comprises a plurality of other wirings passing through the plurality of other through holes and bonded to the plurality of contact portions, respectively.

4. The placing table according to claim 3, wherein the one or more heaters are a plurality of heaters, and
   the one or more first wiring layers are a plurality of first wiring layers connected to the power feed sides of the plurality of heaters, respectively.

5. The placing table according to claim 4, wherein at least one of the one or more second wiring layers is connected to reference potential sides of two or more heaters among the plurality of heaters.

6. The placing table according to claim 3, wherein
   the base includes an other insulating portion disposed in the second region and providing the plurality of other through holes leading to the plurality of other contact portions,
   each of the plurality of other wirings include an other lead wire and an other terminal connected to one end of the other lead wire and electrically connected to a corresponding one among the plurality of other contact portions, and
   a space exists from the other terminal and the other lead wire to an inner surface of the other insulating portion defining one among the plurality of other through holes in which the other terminal and the other lead wire are inserted.

7. The placing table according to claim 1, wherein a coolant flow channel to which a coolant is to be supplied is formed in the base.

8. A plasma treatment apparatus for performing plasma treatment on a workpiece, the plasma treatment apparatus comprising:
   a processing container; and
   the placing table according to claim 1, the placing table being provided in the processing container.

* * * * *